United States Patent [19]
Tanoi

[11] Patent Number: 5,483,204
[45] Date of Patent: Jan. 9, 1996

[54] CLOCK CIRCUIT

[75] Inventor: Satoru Tanoi, Tokyo, Japan

[73] Assignee: Oki Electric Industry Co., Ltd., Tokyo, Japan

[21] Appl. No.: 368,798

[22] Filed: Jan. 4, 1995

[30] Foreign Application Priority Data

Jan. 7, 1994 [JP] Japan .................................. 6-000517

[51] Int. Cl.$^6$ ................................ H03L 7/00; H03L 7/06
[52] U.S. Cl. ........................... 331/14; 331/1 A; 331/25; 331/60; 331/74; 327/155; 327/156; 327/159
[58] Field of Search ............................... 331/1 A, 14, 18, 331/25, 60, 74, 77, 173; 327/105, 107, 142, 155–159, 161–163, 295, 415–418

[56] References Cited

U.S. PATENT DOCUMENTS

| | | | |
|---|---|---|---|
| 4,868,522 | 9/1989 | Popat et al. | 331/2 |
| 5,079,519 | 1/1992 | Ashby et al. | 331/1 A |
| 5,260,979 | 11/1993 | Parker et al. | 331/18 X |
| 5,294,894 | 3/1994 | Gebara | 331/74 X |
| 5,307,381 | 4/1994 | Ahuja | 333/18 X |

FOREIGN PATENT DOCUMENTS 329418  8/1989  European Pat. Off. .
366326  5/1990  European Pat. Off. .

OTHER PUBLICATIONS

"Use of a PLL in a 0.5 μm ASIC: Interface Design as a Crux of Speed Increase", *Nikkei Micro Devices*, Feb. 1993, pp. 81–85 (No author (not translated)).

Mark Horowitz, "Clocking Strategies in High Performance Processors", *1992 Symposium of VLSI Circuits Digest of Technical Papers*, pp. 50–53, (no month, 1992).

Primary Examiner—David Mis
Attorney, Agent, or Firm—Spencer, Frank & Schneider

[57] ABSTRACT

A clock circuit for supplying an output clock signal to a logic circuit, includes a phase difference-to-voltage converter producing a voltage signal corresponding to a phase difference between a basic clock signal and a feedback clock signal, a voltage-controlled phase controller controlled by the voltage signal from the phase difference-to-voltage converter and outputting a first clock signal, a clock supply circuit receiving the first clock signal, and supplying a second clock signal, as the output clock signal, through to the logic circuit, a dummy clock circuit having a dummy capacitance circuit, receiving the first clock signal, and outputting a third clock signal, and a selector selectively supplying the phase difference-to-voltage converter, with a selected one of the output of the clock supply circuit and the output of the dummy clock circuit, as the feedback clock signal.

18 Claims, 10 Drawing Sheets

CLOCK CIRCUIT

BACKGROUND OF THE INVENTION

The present invention relates to a clock circuit, and in particular to a clock circuit using a phase-locked loop (PLL).

Conventionally, for a logic circuit such as a semiconductor integrated circuit, of a large scale and operating at a high speed, including a circuit of a large lead capacitance, and requiring supply of high-frequency clocks, it has been proposed to use a clock circuit using a PLL circuit to reduce the skew between the basic clock such as an external clock and the local clocks in the logic circuit, and the clock skew between the local clocks within the logic circuit.

A clock circuit including such a PLL circuit is described in for example an article "Use of a PLL in a 0.5 μm ASIC: Interface Design as a Crux of Speed Increase" in Nikkei Micro Devices. February 1993, pp. 81–85. However, the above-described clock circuit is associated with the following problems.

(a) When the clock circuit is active, a large lead capacitance is directly connected to the local clock output terminal. Accordingly, there is a substantial power consumption.

(b) If, in a stand-by state of the clock circuit, the operation of time clock circuit including the PLL circuit is inhibited to reduce the power consumption, a waiting time for the pull-in time of the PLL circuit for resuming the active state from the stand-by state will be required. This pull-in time is very long compared with the period of the clock (e.g., several hundreds of micro-seconds for the clock of 100 MHz), and a high-speed operation of the system including the clock circuit is prevented. If, the clock circuit including the PLL circuit is kept operating even in the stand-by state, in order to shorten the time required for transition from the stand-by state to the active state, substantial power as in the active state is consumed in the stand-by state.

SUMMARY OF THE INVENTION

An object of the invention is to reduce power consumption of the logic circuit, and also to shorten the time required for transition from the stand-by state to the active state.

According to one aspect of the invention, there is provided a clock circuit for supplying an output clock signal to a logic circuit, comprising:

a phase difference-to-voltage converter having a first input terminal for receiving a basic clock signal and a second input terminal for receiving a feedback clock signal, and outputting a voltage signal corresponding to a phase difference between said basic clock signal and said feedback clock signal;

a voltage-controlled phase controller controlled by the voltage signal from said phase difference-to-voltage converter and outputting a first clock signal;

a clock supply circuit connected to receive said first clock signal, and supplying a second clock signal, as said output clock signal, through its output terminal to said logic circuit;

a dummy clock circuit having a dummy capacitance circuit, connected to receive said first clock signal, and outputting a third clock signal through its output terminal; and a selector selectively connecting the output terminal of the clock supply circuit or the output terminal of the dummy clock circuit with the second input terminal of said phase difference-to-voltage converter in accordance with a control signal, to thereby output the second or third clock signal as said feedback clock signal.

According to another aspect of the invention, there is provided a clock circuit for supplying block clock signals to logic circuits, comprising:

a phase difference-to-voltage converter having a first input terminal for receiving a basic clock signal and a second input terminal for receiving a feedback clock signal, and outputting a voltage signal corresponding to a phase difference between said basic clock signal and said feedback clock signal;

a voltage-controlled phase controller controlled by the voltage signal from said phase difference-to-voltage converter and outputting a first clock signal;

a decoder responsive to a block address signal and providing block selection signals to respective block selection lines, and making a selected one of the block selection signals active in accordance with the block address signal;

a plurality of block clock supply circuits having respective first input terminals connected to receive said first clock signal, and having respective second input terminals connected to the respective selection lines, each of the block clock supply circuits outputting said block clock signal to the corresponding logic circuit when the corresponding block selection signal is active; and a plurality of switch circuits, each supplying, when the corresponding block selection signal is active, the block clock signal from the corresponding block clock supply circuit to said second input terminal of the phase difference-to-voltage converter.

DETAILED DESCRIPTION OF THE PREFERRED EMBODIMENTS

Embodiment 1

Figure 1:
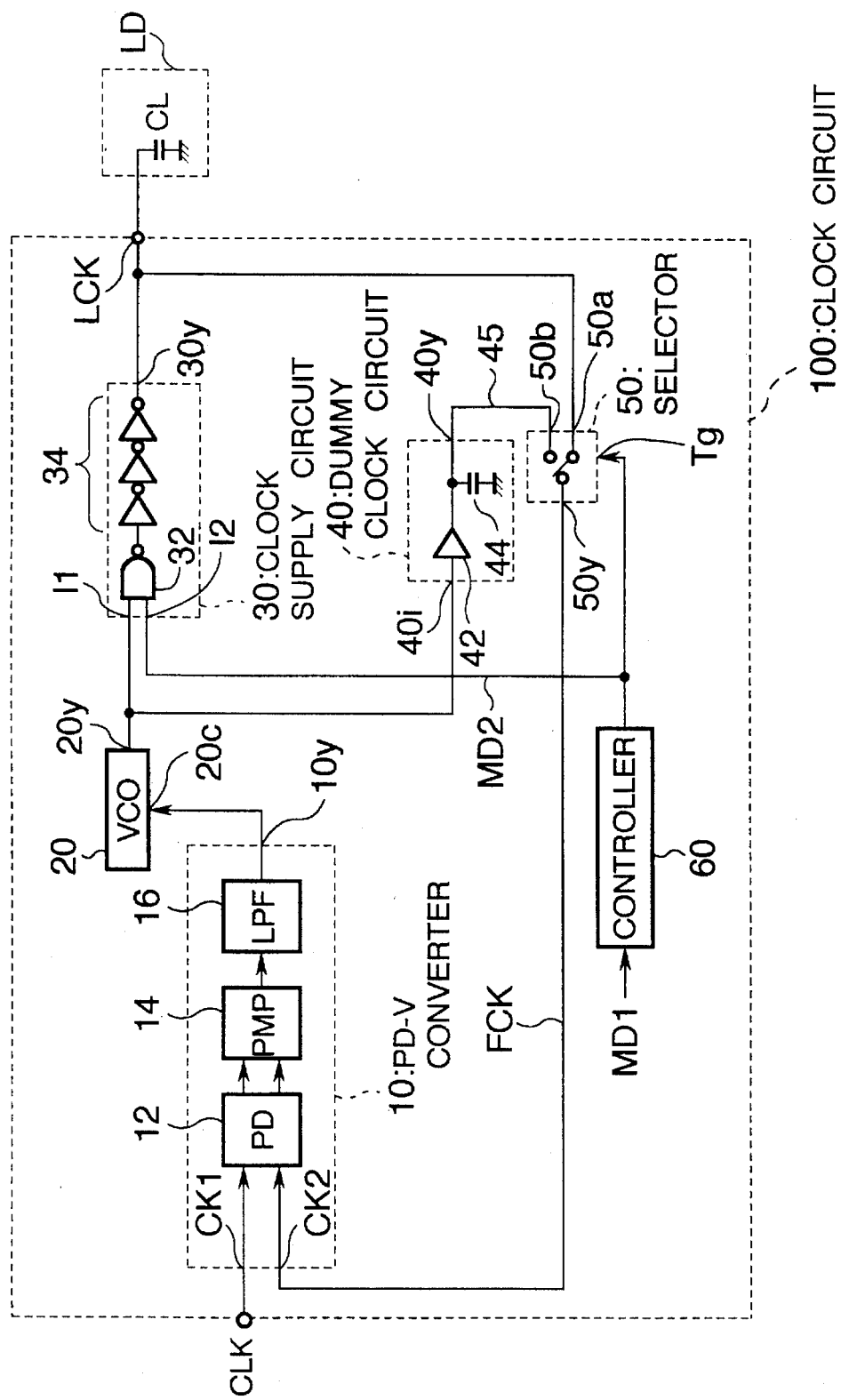
FIG. 1 is a circuit diagram of a clock circuit of Embodiment 1 of the invention.

FIG. 1 is a circuit diagram of a clock circuit of a first embodiment (Embodiment 1) off the invention. Referring to FIG. 1, the clock circuit 100 of this embodiment is connected to a logic circuit, schematically shown as a load circuit LD.

The clock circuit 100 of Embodiment 1 comprises a phase difference-to-voltage converter (hereinafter referred to as PD-V converter) 10 having first and second input terminals CK1 and CK2 for receiving a basic clock CLK and a feedback clock FCK, a voltage-controlled oscillator (VCO) 20 controlled by the output voltage off the PD-V converter 10, a clock supply circuit 30, a dummy clock circuit 40 for generating a dummy clock, and a selector 50. The basic clock CLK input to the first input terminal CK1 of the PD-V converter 10 may be an external clock. The output voltage terminal 10y of the PD-V converter 10 is connected to a control voltage input terminal 20c of the voltage-controlled oscillator 20, and the output terminal 20y of the voltage-controlled oscillator 20 is connected to a first input terminal I1 of the clock supply circuit 30 and the input terminal 401 of the dummy clock circuit 40.

The output terminal 20y of the clock supply circuit 30 is connected to a local clock output terminal LCK supplying the local clock to the load circuit LD, and the input terminal 50a of the selector 50, and the output terminal 40y of the dummy clock circuit 40 is connected via a dummy clock line DCK to the second input terminal 50b of the selector 50, and the output terminal 50y of the selector 50 is connected to the feedback clock line, also denoted by FCK, and the feedback clock line FCK is connected to the second clock input terminal CK2 of the PD-V converter 10 for inputting the feedback clock FCK.

The PD-V converter 10 is formed of a phase decoder 12, a charge pump circuit 14, and a low-pass filter 16, as in the conventional circuit, and converts the phase difference between the two input clocks CK1 and CK2 into a voltage signal and outputs the voltage signal from the output voltage terminal 10y.

The clock supply circuit 30 is formed of a NAND gate 32 having a first input terminal connected to the first input terminal I1 of the clock supply circuit 30, and a second input terminal connected to the second input terminal I2 of the clock supply circuit 30, and an odd number of stages of inverters 34 having an input terminal connected to the output terminal of the NAND gale 32, clock supply circuit 30.

The dummy clock circuit 40 is provided with a buffer 42, and an input terminal of the buffer 42 is connected to the input terminal 40i of the dummy clock circuit 40, and an output of the buffer 42 is connected to a dummy capacitance circuit 44 and the output terminal 40y of the dummy clock circuit 40. The capacitance of the dummy capacitance circuit 44 is designed to be small compared with the equivalent capacitance CL of the dummy load LD. It is also so designed that the ratio (DCL/CL) between the capacitance DCL of the dummy capacitance circuit 44 and the equivalent capacitance CL of the load circuit LD, and the ratio Kdcs/Kcs between the current drive capability Kdcs of the buffer 42 and the current drive capability Kcs of the clock supply circuit 30 are substantially equal to each other.

For example, when the control terminal Tg is at a High level, the selector 50 connects its first input terminal 50a with its output terminal 50y, and thereby connecting the local clock output terminal LCK with the feedback clock line FCK. When the control terminal Tg is at a Low level, the selector 50 connects its second input terminal 50b with its output terminal 50y, thereby connecting the output terminal 40y of the dummy clock circuit 40 with the feedback clock line FCK.

The clock circuit 100 of Embodiment 1 is provided with a controller 60 which receives an operation mode control signal MD1. The output off the controller 60 is also called an operation mode control signal, but is denoted by a reference mark MD2, and is identical to the operation mode control signal MD1 supplied to the controller 60, but differs from it in that its transition between active and inactive states is delayed. The output of the controller 60 is supplied to the second infant, terminal I2 of the clock supply circuit 30 and the control terminal Tg of the selector 50.

Figure 2:
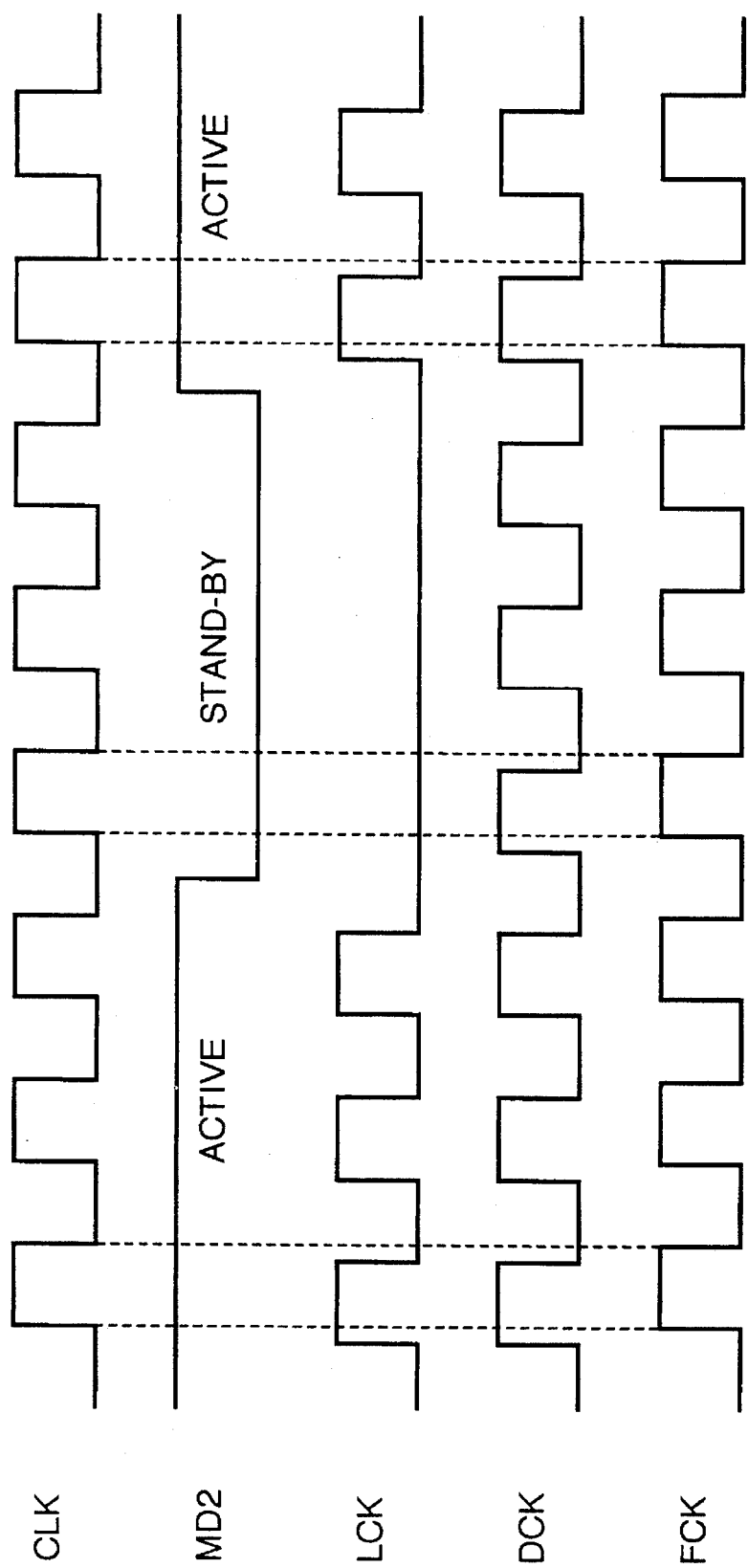
FIG. 2 is a time chart showing the operation of the clock circuit of Embodiment 1.

FIG. 2 is a time chart showing the operation of the clock circuit 100 of Embodiment 1. The operation of the clock circuit 100 of Embodiment 1 will next be described with reference to the time chart of FIG. 2 and FIG. 1. When the operation mode control signal MD2 is active (at the High level), the second input terminal I2 of the clock supply circuit 30 is active (at the High level). The clock supply circuit 30 is active, and the internal clock is supplied via the local clock output terminal LCK to the load circuit LD. The local clock is a little advanced in phase relative to the basic clock CLK. The local clock on the local clock output terminal LCK is fed back via the selector 50 to the PD-V converter 10, and thus operation of a PLL circuit is achieved.

The local clock is a little delayed by the selector 50, and becomes substantially in phase with the basic clock. After expiration of the pull-in time of the PLL after the power-on, the clock circuit 100 will be in a PLL lock-on state, and a clock signal whose phase difference from the basic clock CLK is very small regardless of the magnitude of the load capacitance CL will be obtained on the local clock output terminal LCK. The process of PLL pull-in is not relevant to the invention, so its illustration is omitted from FIG. 2.

When the operation mode control signal MD2 is changed from active (High level) to the stand-by state (Low level), the second input terminal I2 of the clock supply circuit 30 is changed to inactive (Low level) by the controller 60. The clock supply circuit 30 is then deactivated, and supply of the internal clock to the load circuit LD is terminated. The output terminal of the dummy clock circuit 40, i.e., the dummy clock DCK is fed back via the selector 50 to the PD-V converter 10.

The dummy clock circuit 40 is so designed that the dummy clock DCK is in phase with the local clock LCK. Like the local clock LCK, the dummy clock DCK is delayed a little by the selector 50 so as to be in phase with the basic clock CLK. Accordingly, the phase off the clock supplied to the feedback clock line FCK is unchanged, even if the selector 50 switches from its one input to another, as shown in FIG. 2. Furthermore, since the capacitance DCL of the dummy capacitance circuit 44 of the dummy clock circuit 40 and the current drive capability Kdcs of the buffer 42 are designed as described above, the phase difference between the dummy clock DCK and the local clock LCK is small. Accordingly, even if the signal fed back to the PD-V converter 10 is switched to the output of the dummy clock circuit 40, the lock-on state of the PLL is maintained.

When the operation mode control signal MD2 is subsequently returned from the stand-by state (Low level) to the active state (High level), supply of the internal clock by the clock supply circuit 30 is resumed, and the internal clock begins to be fed back. The lock-on state of the PLL is also maintained.

Embodiment 1 described so far has the following advantages.

Even when the operation mode control signal MD2 is switched between the active state and the stand-by state, the lock-on state of the PLL is maintained. As a result, the waiting time is required only after the power-on. Once, the PLL locks on, even at the time of transition from the stand-by state to the active state, no waiting time for the pull-in of the PLL circuit is required. As a result, high speed operation of the system, including the clock circuit, is possible.

In the stand-by state, supply of the internal clock to the load circuit LD having a large capacitance CL is prevented, and the dummy clock circuit 40 alone is operating. The dummy capacitance DCL of the dummy capacitance circuit 44 in the dummy clock circuit 40 is designed to be small capacitance compared with the equivalent capacitance CL of the load circuit LD, as described above. Accordingly, the power consumption during the stand-by state can be reduced substantially.

Thus, according to Embodiment 1, switching between the stand-by state and the active state can be achieved quickly, and time power consumption during the stand-by state can be reduced, and a circuit having a low clock skew can be obtained.

Figure 3:
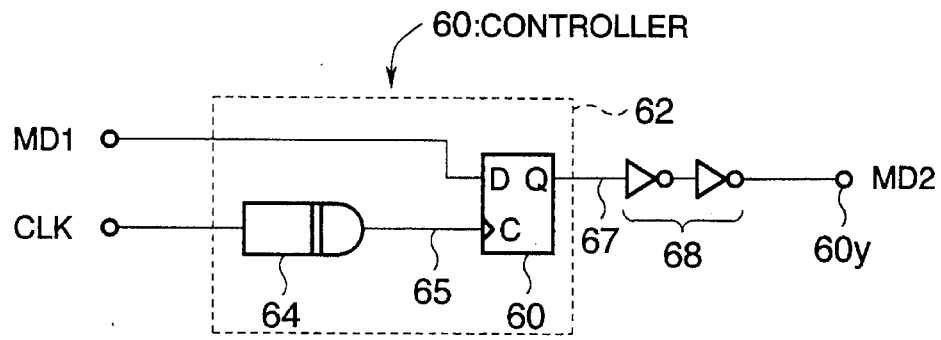
FIG. 3 is a circuit diagram of a controller of the clock circuit of Embodiment 1.

FIG. 3 is a circuit diagram showing an example of the controller 60 in the clock circuit 100 in Embodiment 1. The controller 60 comprises a synchronizing circuit 62 formed of a delay circuit 64 to which the basic clock CLK is input, and a D-type flip-flop 66. The basic clock CLK is input to the input of the delay circuit 64, and the output of the delay circuit 64 is connected to a node 65. The node 65 is connected to the clock input terminal C of the D-type flip-flop 66. The operation mode control signal MD1 is input to the data input terminal D of the D-type flip-flop 66. The output 67 of the synchronizing circuit 62 is connected to the output terminal 60y of the controller 60 via inverters 68 and a suitable gale circuit or the like, not shown. The output at the output terminal 60y provides time operation mode control signal MD2.

Figure 4:
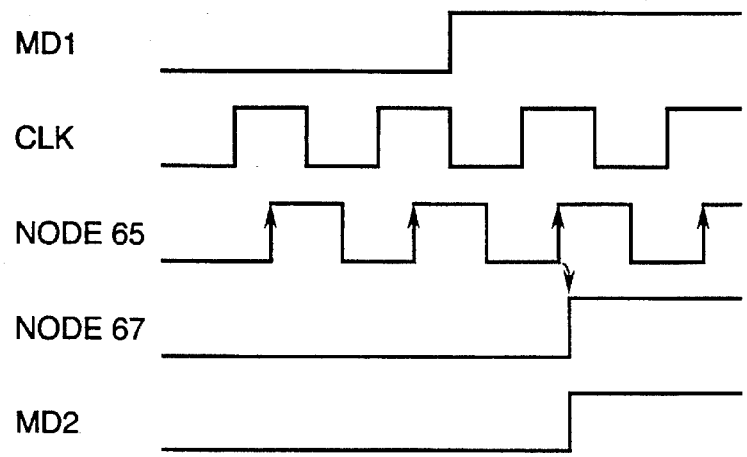
FIG. 4 is a time chart showing the operation of the controller of FIG. 3.

FIG. 4 is a time chart showing the operation of the controller 60. As will be seen from FIG. 4, a clock signal delayed from the basic clock by a predetermined time is obtained on the node 65. When the operation mode control signal MD1 changes, the change is read by the flip-flop 66, at the rising edge of the signal on the node 65. The level of the control signal MD2 is effected at a predetermined time after each edge of the basic clock CLK. Accordingly, the switching of the selector 50 is effected at a timing shifted from the edges of the clock supplied to the selector 50.

Figure 5:
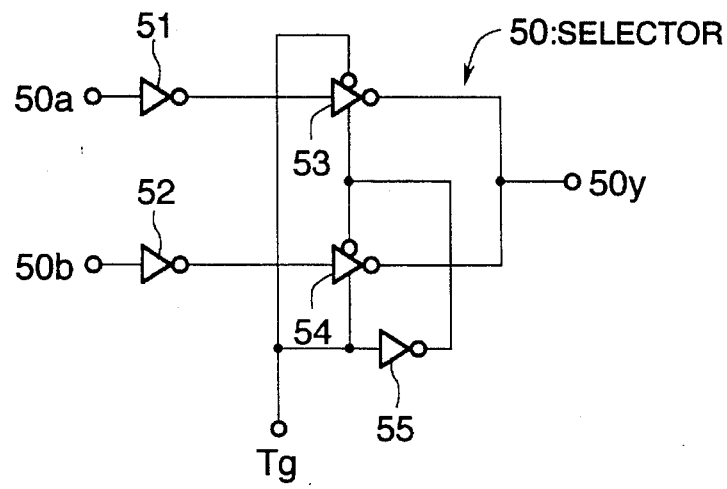
FIG. 5 is a circuit diagram of a selector of the clock circuit of Embodiment 1.

FIG. 5 is a circuit diagram strewing an example of the selector 50 in the clock circuit 100 in Embodiment 1. The selector 50 comprises first and second inverters 51 and 52 having their input terminals connected to the first and second input terminals 50a and 50b of the selector 50, a third inverter 55 having its input terminal connected to the control terminal Tg of the selector 50, a first clocked inverter 53 having its input terminal connected to the output terminal of the first inverter 51, its output terminal connected to the output terminal 50y of the selector 50, its first gate terminal connected to the output terminal of the third inverter 55, and its second gate terminal connected to the control terminal Tg, and a second clocked inverter 54 having its input terminal connected to the output terminal of the second inverter 52, its output terminal connected to the output terminal 50y, its first gate terminal connected to the control terminal Tg, and its second gate terminal connected to the output terminal of the third inverter 55.

Embodiment 2

Figure 6:
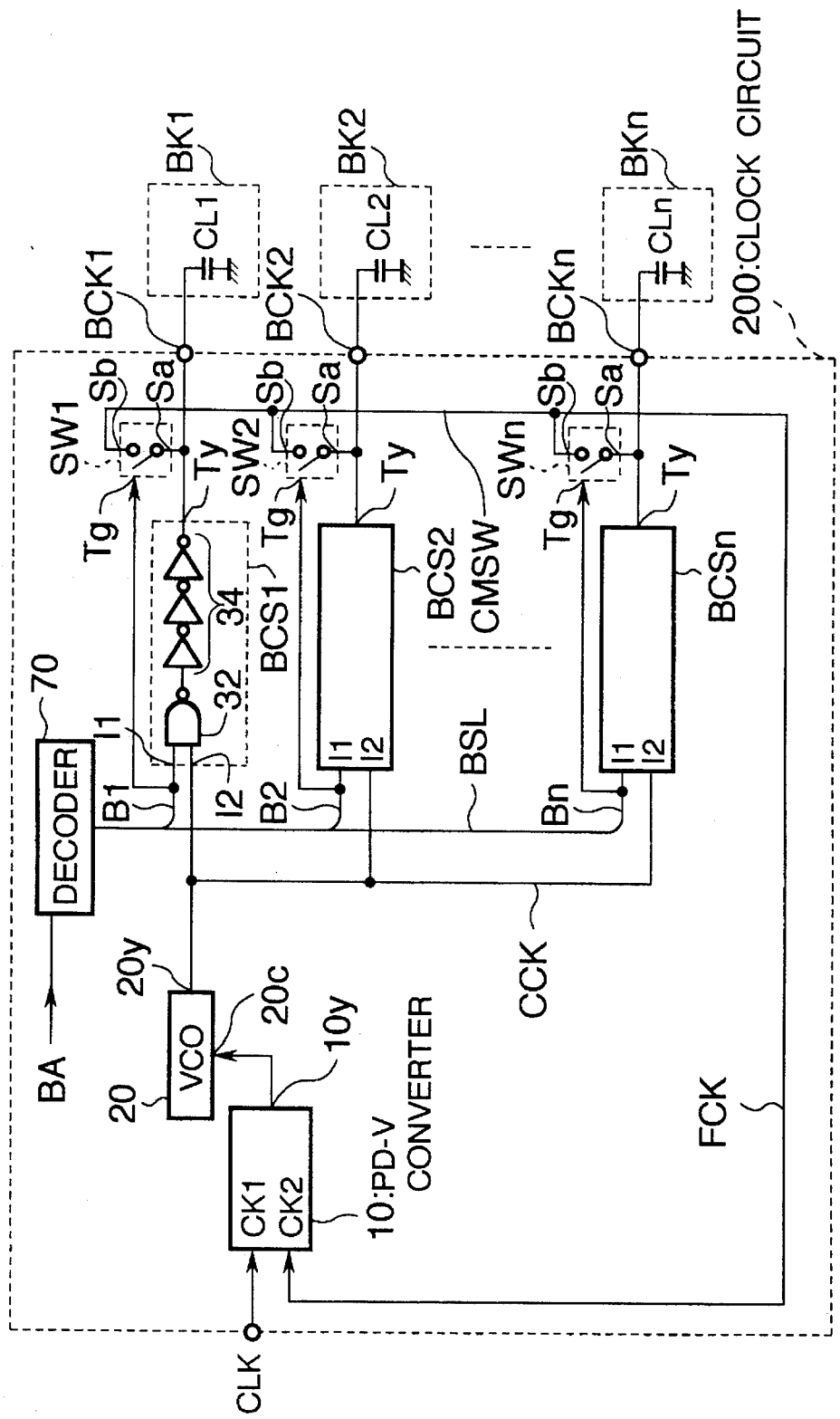
FIG. 6 is a circuit diagram of a clock circuit of Embodiment 2 of the invention.

FIG. 6 is a circuit diagram of a clock circuit 200 of a second embodiment (Embodiment 2) of this invention. The clock circuit 200 of this embodiment supplies clock signals, called block clock signals, BCK1, BCK2 . . . BCKn to a plurality of blocks BK1, BK2 . . . BKn. Specifically, a selected one of the block clock signals is supplied to the corresponding block BK1, BK2 . . . or BKn selected by a block address signal BA.

Like the clock circuit 100 in Embodiment 1, the clock circuit 200 comprises a PD-V converter 10 to which the basic clock CLK and the feedback clock FCK are input, and a voltage-controlled oscillator 20 controlled by the output voltage from the PD-V converter 10. The output terminal 20y of the voltage-controlled oscillator 20 is connected to a common clock line CCK.

The clock circuit 200 further comprises a decoder 70 to which the block address signal BA is input, and a plurality of block selection lines B1, B2, . . . Bn (an assembly of which is denoted by BSL) connected to respective output terminals of the decoder 70. The clock circuit 200 further comprises block clock supply circuits BCS1, BCS2, . . . BCSn, and switch circuits SW1, SW2, . . . SWn provided for the respective blocks BK1, BE2, . . . BKn and controlled by the block selection lines B1, B2, . . . Bn. For the control, the block selection lines B1, B2, . . . Bn are respectively connected to the first input terminals I1 of the block clock supply circuit BCS1, BCS2, . . . BCSn, and to control terminals Tg of the respective switch circuits SW1, SW2, . . . SWn. The common clock line CCK is connected to all the second input terminals I2 of the block clock supply circuit BCS1, BCS2, . . . BCSn.

The output terminals Ty of the block clock supply circuits BCS1, BCS2, . . . BCSn are connected via the block clock output terminals BCR1, BCK2, . . . BCKn to the corresponding blocks BR1, BK2, . . . BKn, for supplying the clocks, also denoted by BCK1, BCK2, . . . BCKn, to the respective blocks BR1, BR2, . . . BKn. The output terminals Ty of the block clock supply circuits BCS1, BCS2, . . . BCSn are also connected to the first input terminals Sa of the switch circuit SW1, SW2, . . . SWn. The second terminals Sb are commonly connected to a common output line CMSW which is directed connected to the feedback clock line FCK. The feedback clock line FCK is connected to the second clock input terminal CK2 of the PD-V converter 10.

The block clock supply circuit BCS1, BCS2, . . . BCSn have the same configuration as the clock supply circuit 30 in Embodiment 1. The capacitances of the respective blocks BK1, BK2, . . . BKn are denoted by equivalent load capacitances CL1, CL2, . . . CLn of the blocks. Each of the equivalent capacitances CL1, CL2, . . . CLn in the integrated circuit having been divided into n blocks is 1/n of the total load capacitance CL for the clock in the integrated circuit (if the blocks are of equal size), and is therefore substantially smaller than the that of the integrated circuit which is not divided.

The switch circuit SW1, SW2, . . . SWn connect the block clock lines BCK1, BCK2, . . . BCKn with the common output line CMSW when the control terminals Tg are at the High level, and disconnect them when the control terminals Tg are at the Low level.

Figure 7:
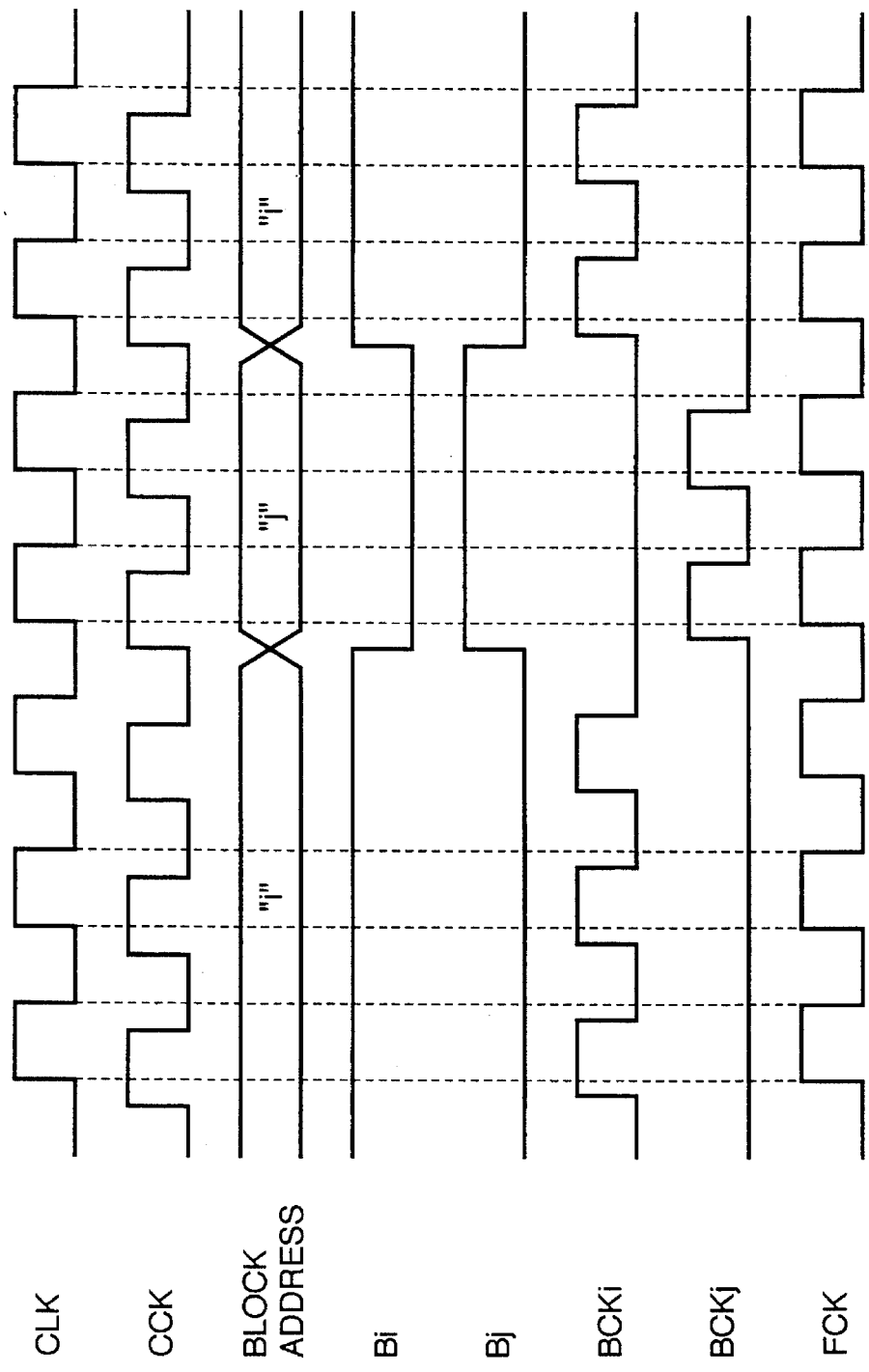
FIG. 7 is a time chart showing the operation of the clock circuit of Embodiment 2.

The operation of the clock circuit of Embodiment 2 will next be described. FIG. 7 is a time chart showing the operation of the clock circuit of Embodiment 2. In Embodiment 2, the clock circuit is always in the active slate, and the clock is always supplied to the common clock line FCK.

Let us assume that the block address signal designating block address "i" is input and the block selection line Bi is active (at the High level). Then, only the block clock supply circuit BCSi is active, and the block clock is applied via the block clock line BCKi to the block BK1. Also, the block clock BCKi is fed back to the PD-V converter 10 via the switch circuit SWi, to form a PLL. Accordingly, upon expiration of a predetermined time after the power-on, the PLL is in the lock-on state, and the clock signal with a very small phase difference from the basic CLK is obtained without regard to the magnitude of the load capacitance CL1. During this period, no clock is supplied to other blocks.

If the block address changes from "i" to "j", as shown in FIG. 7, the block selection line Bi is deactivated and the block selection line Bj is activated. As a result, the supply of the clock from the block clock supply circuit BCSi to the block BKi is terminated, and the supply of the clock from the block clock supply circuit BCSj to the block BKj is commenced. The block clock BCKj is fed back to the PD-V converter 10 via the switch circuit SWj, and the PLL is maintained in the lock-on state. Accordingly, the clock with a very small phase difference from the basic clock CLK is supplied also to the block BKj. During this period, no clock is supplied to other blocks.

Embodiment 2 has the following advantages. First, clocks with a very small phase difference from the basic clock CLK can be supplied to every block BKi without regard to the value of the load capacitances LCi. Moreover, upon expiration of a predetermined time after power-on, the PLL is maintained in the lock-on state, so that no waiting time for the pull-in is required. Furthermore, the clock is supplied only to the selected block, and only such a power for driving an equivalent load capacitance CLi for one block is consumed. As described above, each of the equivalent load capacitances CL1, CL2, . . . CLn can be made substantially small compared with the arrangement in which no division is made. Accordingly, it is possible to obtain a clock circuit with which the power consumption in the active state can be made small, and the clock skew can also be made small.

Figure 8:
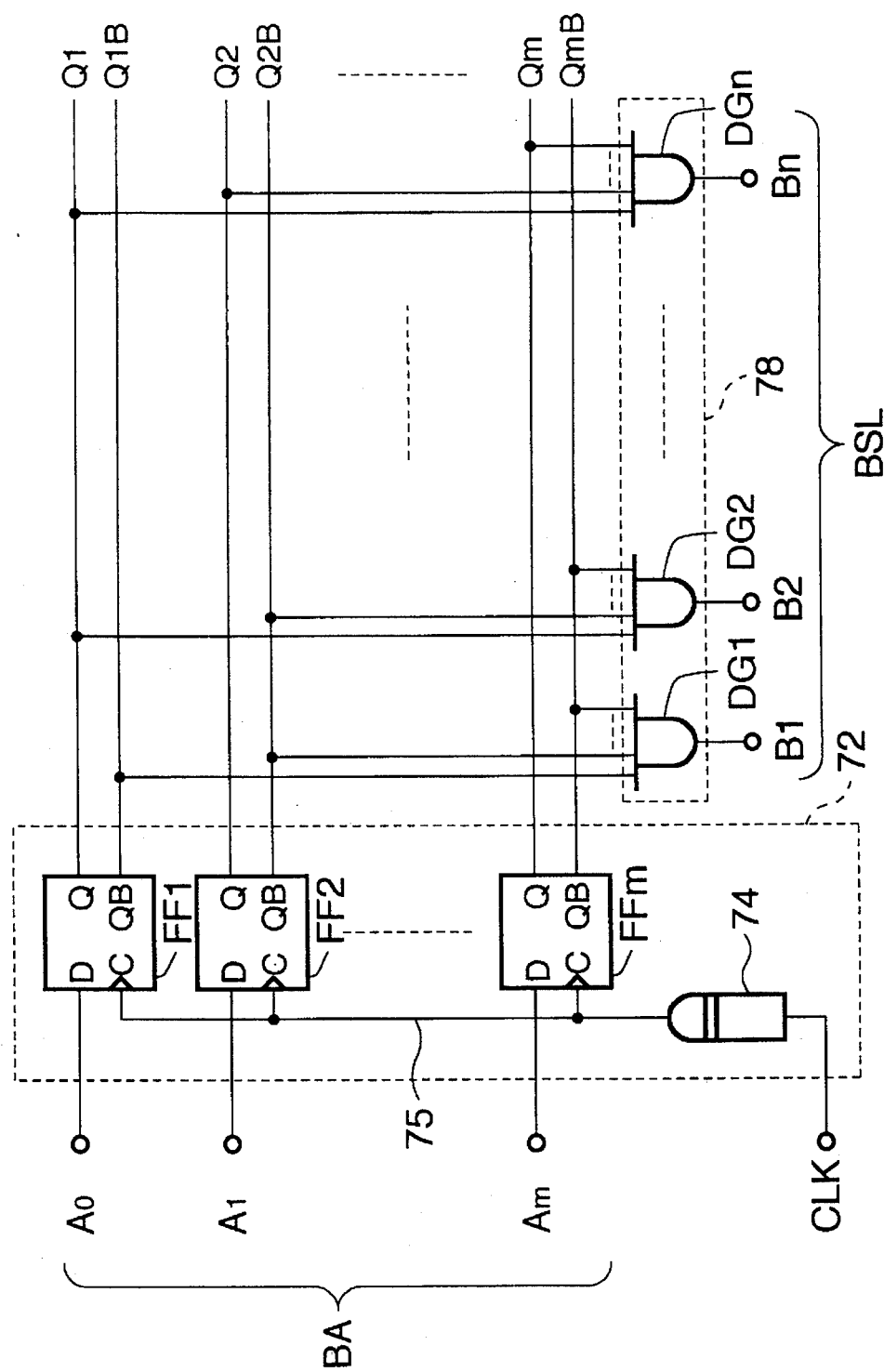
FIG. 8 is a circuit diagram of a decoder of the clock circuit of Embodiment 2.

FIG. 8 shows an example of the decoder 70 used in Embodiment 2. The illustrated decoder 70 comprises a synchronizing circuit 72 comprising a delay circuit 74 to which the basic clock CLK is input, and a plurality of D-type flip-flops FF1, FF2, . . . FFm. In the synchronizing circuit 72, the output of the delay circuit 74 is connected to the node 75, and the node 75 is commonly connected to the clock input terminals C of the D-type flip-flops FF1, FF2, . . . FFm, and the predetermined bits of the block address are input to the data input terminals of the D-type flip-flops FF1, FF2, . . . FFm. The outputs (at the nodes Q1, Q2, . . . Qm) of the synchronizing circuit 72 are connected via decode gates DG1, DG2, . . . DGn to the block selection lines BSL (consisting of B1, B2, . . . Bn).

The decoder 70 of Embodiment 2 operates as follows. The clock signal CCK is delayed by a predetermined time from the basic clock CLK by the delay circuit 74, and the delayed clock signal is obtained on the node 75. When the block address BA changes, the change is read at the rising edge of the clock on the node 75 into the D-type flip-flops FF1, FF2, . . . FFm, and the nodes Q1, Q2, . . . Qm of the synchronizing circuit 72 change. As a result, the block selection line BSL changes at a time point a predetermined time after an edge of the basic clock.

Accordingly, the timing of the switching of the block selection lines BSL is different from the clock edge of the feedback clock line FCK, and a stable clock circuit free from erroneous operation can be obtained.

Embodiment 3

Figure 9:
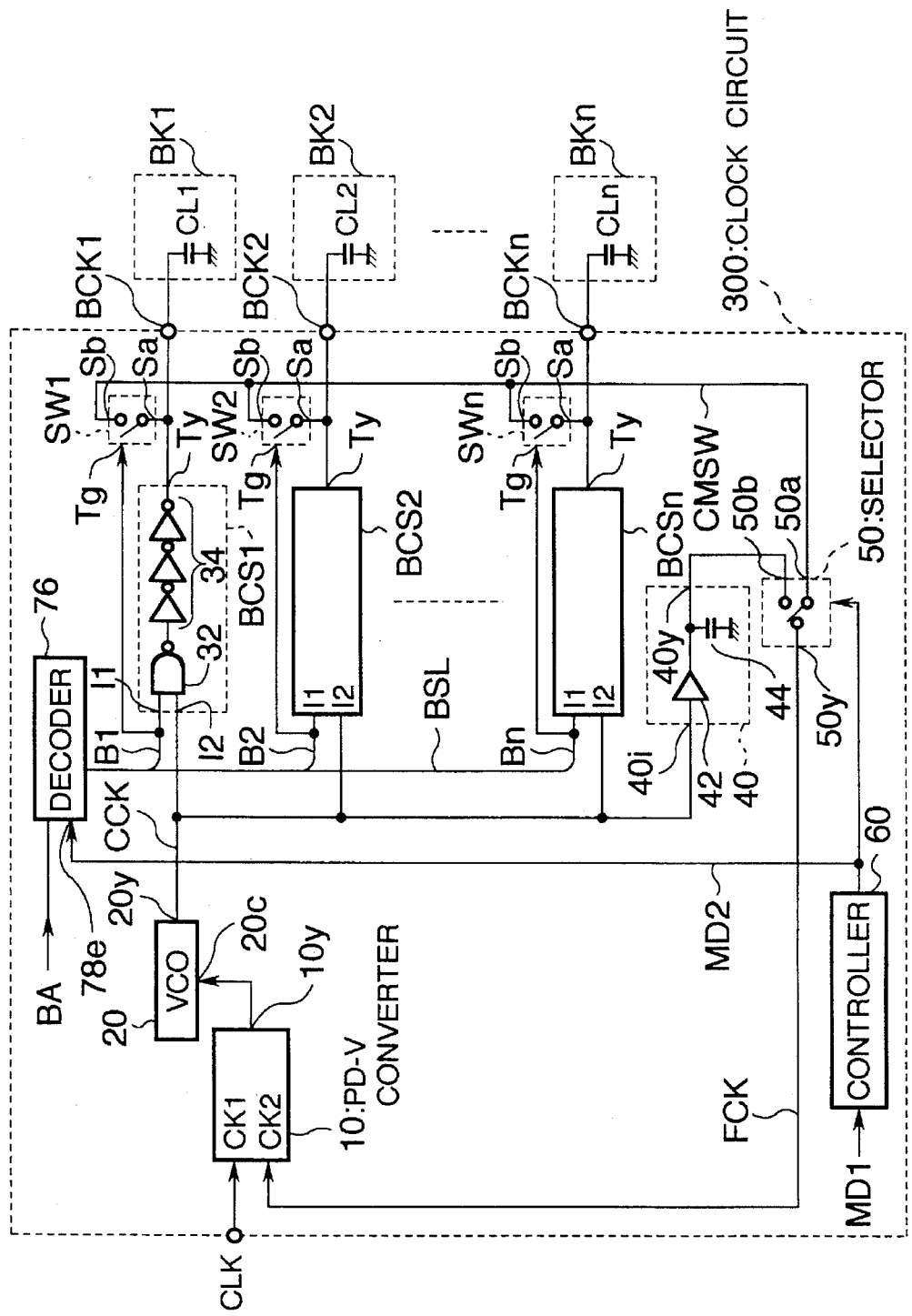
FIG. 9 is a circuit diagram of a clock circuit of Embodiment 3 of the invention.

FIG. 9 is a circuit diagram of a clock circuit of the third embodiment (Embodiment 3) of this invention. The clock circuit 300 of Embodiment 3 is similar to the clock circuit 200 of Embodiment 2, but a dummy clock circuit 40 and a selector 50 are added. The following description is centered on the difference between the clock circuit of Embodiment 3 and the clock circuit of Embodiment 2.

The configurations of the dummy clock circuit 40 and the selector 50 in the clock circuit of Embodiment 3 are identical to those in Embodiment 1. However, it is so designed that the ratios DCL/CL1, DCL/CL2, . . . DCL/CLn between the capacitance DCL of the dummy capacitance circuit 44 of the dummy clock circuit 40 and the equivalent capacitances CL1, CL2, . . . CLn of the respective blocks are substantially equal to the ratios Kdcs/DBCS1, Kdcs/DBCS2, . . . Kdcs/DBCSn between the current drive capability Kdcs of the buffer 42 anti the current drive capabilities DBCS1, DBCS2, . . . DBCSn of the clock supply circuit BCS1, BCS2, . . . BCSn.

The second terminals Sb of the switch circuit SW1, SW2, . . . SWn are connected to the common output line CMSW, which is turn is connected to the first input terminal 50a of the selector 50. The input terminal 40i of the dummy clock circuit 40 is connected to the common clock line CCK, and the output terminal 40y of the dummy clock circuit 40 is connected to the second input terminal 50b of the selector 50. The output terminal 50y of the selector 50 is connected to the feedback clock line FCK, and the feedback clock line FCK is connected to the second clock input terminal CK2.

In this embodiment the selector 50 is used as a switching circuit for connecting the output of the dummy clock circuit 40 to the second input terminal CK2 of the PDV converter 10 when the operation mode control signal MD2 is in the stand-by state.

In the clock circuit 300 in Embodiment 3, the decoder 70 in FIG. 6 is replaced by a decoder 76 including an enable/disable circuit 78 for deactivating all the block selection lines responsive to the level of the control terminal 78e. The control terminal 78e of the decoder 76 and the control terminal TK of the selector 50 are commonly connected to the node MD2.

Figure 10:
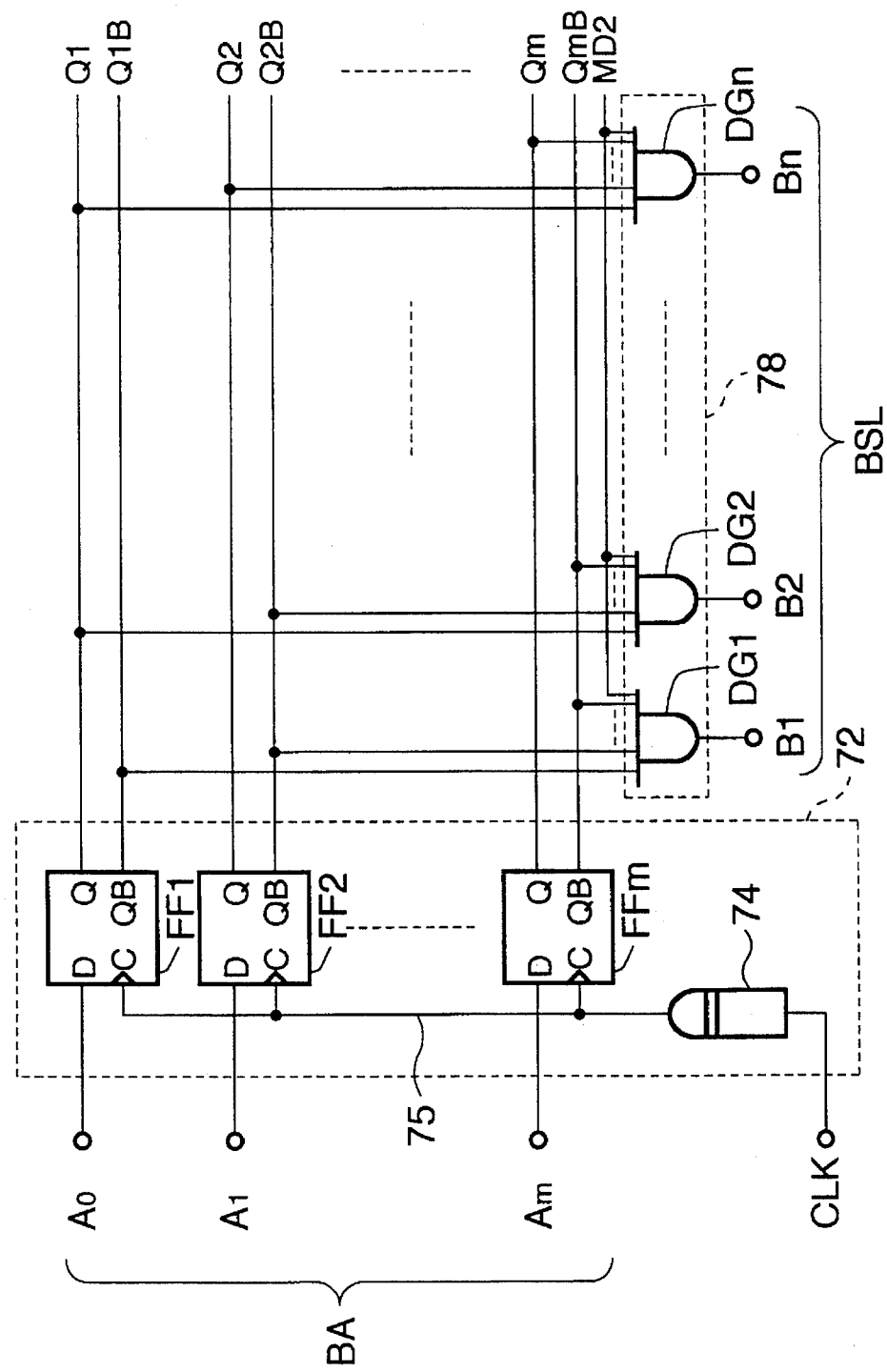
FIG. 10 is a circuit diagram of a decoder of the clock circuit of Embodiment 3.

The decoder 76 in the clock circuit 300 of Embodiment 3 is configured as shown in FIG. 10. It is similar to the decoder 70 shown in FIG. 8, but differs from in that the decode gates DG1, DG2, . . . DGn are provided with additional inputs which are commonly connected to the control terminal 78e of the decoder 76.

Members in the clock circuit 300 in Embodiment 3 which are identical to those in the clock circuit 100 or 200 in Embodiments 1 and 2 are denoted by identical reference numerals.

The operation of the clock circuit of Embodiment 3 will next be described. A time chart for Embodiment 3 is substantially identical to that of Embodiment 2, so it is omitted.

First, let us assume that the operation mode control signal MD2 is active. In this case, like Embodiment 2, the block clock is supplied via the block clock output terminal BCKi to the block BKi selected by the block address signal BA. The block clock is fed back via the switch circuit SWi and the selector 50 to the PD-V converter 10, forming a PLL, and the PLL is made in the lock-on state. Accordingly, the block clock having a very small phase difference from the basic clock CLK is obtained. Moreover, the lock-on state of the PLL is maintained even when the signal changes.

When the operation mode control signal MD2 changes from the active state to the stand-by state, all the block selection lines BSL are deactivated by the enable/disable circuit 78 of the decoder 76, and the supply of the block clock is stopped. The output of the dummy clock circuit 40 is fed back via the selector 50 to the PD-V converter 10, and the lock-on state of the PLL is maintained.

When the operation mode control signal MD2 subsequently changes from the stand-by state to the active state, the supply and the feedback of the block clock are resumed, and the lock on state of the PLL is maintained.

Thus, the clock circuit 300 of Embodiment 3 operates in the same manner as the clock circuit 200 of Embodiment 2 when the operation mode control signal MD2 is active, and operates in the same manner as the clock circuit 100 of Embodiment 1 when the operation mode control signal MD2 is inactive, and during the period when the operation mode control signal MD2 changes from the active state to the stand-by state. With the clock circuit 300 of Embodiment 3, the power consumption when the operation mode control signal MD2 is active is reduced, and the clock skew can be reduced. Moreover, with the clock circuit 300 of Embodiment 3, quick switching between the stand-by state and the active state of the operation mode control signal MD2, and reduction in the power consumption during the stand-by period of the operation mode control signal MD2 are both achieved.

According to Embodiment 3 shown in FIG. 9, the power consumption during the stand-by state can be made smaller, than in Embodiment 1. The reason therefor will be explained below.

In the circuit of FIG. 1, the following relationship must be satisfied to reduce the phase difference:

$$CL/Kcs \equiv to\ DCL/Kdcs \quad (1)$$

where CL represents the capacitance of the load circuit;

Kcs represents the driving capability of the clock supply circuit 30;

DCL represents the capacitance of the dummy clock circuit 40; and

Kdcs represents the driving capability of the dummy clock circuit 40.

The driving capability of the clock supply circuit 30 or the dummy clock circuit 40 is proportional to W/L, where W and L respectively represent the width and length of the PMOS and NMOS transistors forming the inverter of the last stage of the respective circuit.

By reducing DCL so as to be sufficiently small compared with CL, while satisfying the relationship (1), i.e., by reducing both DCL and Kdcs, the consumption current in the stand-by state can be reduced.

From the viewpoint of restraining the manufacturing variation, it is desirable to make the lengths of the gates of the transistors of the clock supply circuit 30 and the dummy clock circuit 40. The desired reduction in Kdcs therefore needs to be achieved by reducing the gate width. However, there is a limit in the reduction in the gate width from the standpoint of fabrication technique. Accordingly, there is a limit in the reduction of the driving capability of the dummy clock circuit, and there is therefore a limit to the reduction in the consumption current.

In Embodiment shown in FIG. 9, the relationship which must be satisfied is as follows:

$$CLi/Kbcsi \equiv DCL'/Kdcs' \quad (2)$$

where CLi (i=1, 2, ..., n) represents the capacitance of each load circuit BKi;

Kbcsi represents the driving capability of each block clock supply circuit BCSi;

DCL' represents the capacitance of the dummy clock circuit 40; and

Kdcs' represents the driving capability of the dummy clock circuit 40.

Since the load capacitance CL of Embodiment 1 is divided into n blocks, $$CLi=CL/n \quad (3)$$

Using the equation (3), and assuming $$Kbcs1=KBcs2=\ldots =Kbcsn=Kbcs$$

the relationship (2) can be rewritten as follows:

$$DCL' \equiv CL \cdot Kdcs'/n \cdot Kbcs \quad (4)$$

Assuming that the circuits of Embodiment 1 and Embodiment 3 are fabricated under identical conditions, and it is assumed that the driving capabilities of the clock supply circuit 30 and the block clock supply circuits BCSi, and the dummy clock circuit 40 are identical with each other. It is also assumed that $$Kdcs'/Kbcs=Kdcs/Kcs=\gamma \quad (5)$$

Substituting the relationship (5) in the relationships (4) and (1), $$DCL' \equiv CL \cdot \gamma/n$$

$$DCL \equiv CL \cdot \gamma$$

Therefore $$DCL' \equiv DCL/n$$

That is, the driving capability of the each circuit can be within a range which can be fabricated without difficulty, and yet the dummy capacitance DCL' can be made to be 1/n of DCL of Embodiment 1. The consumption current in the standby state can therefore be made to be 1/n.

Thus, with the clock circuit 300 of Embodiment 3, the dummy capacitance circuit 44 in the dummy clock circuit 40 can be made small, and the power consumption during the stand-by period of the operation mode control signal MD2 can be reduced.

Moreover, with the clock circuit 300 of Embodiment 3, the parasitic capacitance on the common output line CMSW commonly connected to the first terminals Sa of the switch circuit SW1, SW2, ..... SWn, and the parasitic capacitance of the feedback clock line FCK are separated by the selector 50, and the feedback line FCK is driven by the selector 50, which for example is configured as shown in FIG. 5. Because of the division, the parasitic capacitance acting as a lead to each driving circuit is reduced, and accordingly, waveforms which vary sharply can be easily obtained on the common output line CMSW and the feedback clock line FCK. This facilitates the layout design for speed-up in the ease of a large-sized clock circuit.

Embodiment 4

Figure 11:
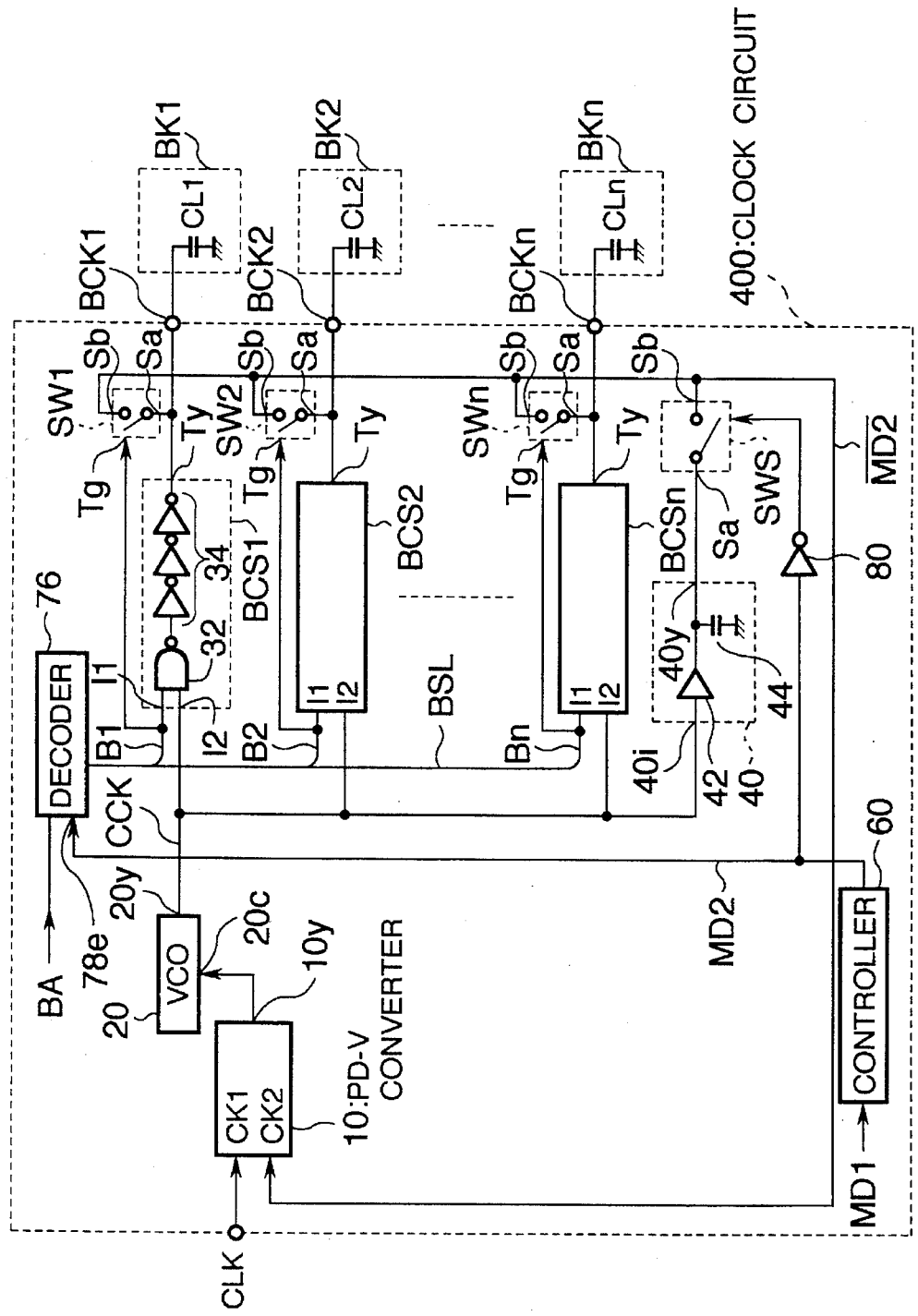
FIG. 11 is a circuit diagram of a clock circuit of Embodiment 4 of the invention.

FIG. 11 is a circuit diagram of a clock circuit 400 of a fourth embodiment (Embodiment 4) of the invention.

The clock circuit 400 of this embodiment is similar to the clock circuit 300 of Embodiment 3, but the selector 50 is removed, and a second switch circuit SWS is added between the dummy clock circuit 40 and the feedback clock line FCK. The output terminal 40y of the dummy clock circuit 40 is connected to the first terminal Sa of the second switch circuit SWS. The second terminal Sb of the second switch circuit SWS, and the second terminals Sb of the first switch circuits SW1, SW2, ..... SWn are commonly connected to the feedback clock line FCK. The control terminal Tg of the second switch circuit SWS is connected to receive a control signal MD2, via an inverter 80 whose input is connected to the output of the controller 60. The members identical to those in the clock circuit 300 of Embodiment 3 are denoted by identical reference numerals and their description is omitted.

The operation of the clock circuit 400 of Embodiment 4 will next be described. In the clock circuit 400 of Embodiment 4, when the operation mode control signal MD2 is active, the block clock for the selected block BKi is fed back via the first switch circuit SWi alone to the PD-V converter 10. When the operation mode control signal MD2 is in the stand-by state, the output 40y of the dummy clock circuit 40 is fed back via the second switch circuit SWS to the PD-V converter 10. The operation other than the above is similar to that of the clock circuit 300 of Embodiment 3, and its description is omitted.

Like the clock circuit 300 of Embodiment 3, the clock circuit 400 of Embodiment 4 has the following advantages. First, it is possible to reduce the power consumption when the operation mode control signal MD2 is active, and to reduce the clock skew. Moreover, the switching between the stand-by state and the active state of the operation mode control signal MD2 is quick, and the power consumption can be reduced when the operation mode control signal MD2 is in the stand-by state. Furthermore, in the clock circuit 400 of Embodiment 4, the block clock and the dummy clock are fed back via a single switch circuit only (In contrast, the block clock is fed back via the switch circuit and the selector in Embodiment 3), the phase difference between the block clock and the dummy clock fed back to the PD-V converter 10 is reduced. In other words, the difference between the phase difference between the block clock and the basic clock, and the phase difference between the dummy clock and the basic clock can be reduced.

Modifications

The embodiments described above may be modified in the following manners.

In Embodiments 1 to 4, a frequency-divider may be provided between the feedback clock line FCK and the PD-V converter 10. By providing the frequency-divider, an internal clock or a block clock of a frequency which is an integer multiple of the frequency of the basic clock can be supplied. Predetermined ones of edges of the internal clock or the block can be made to periodically coincide with the edges of the basic clock.

Figure 12:
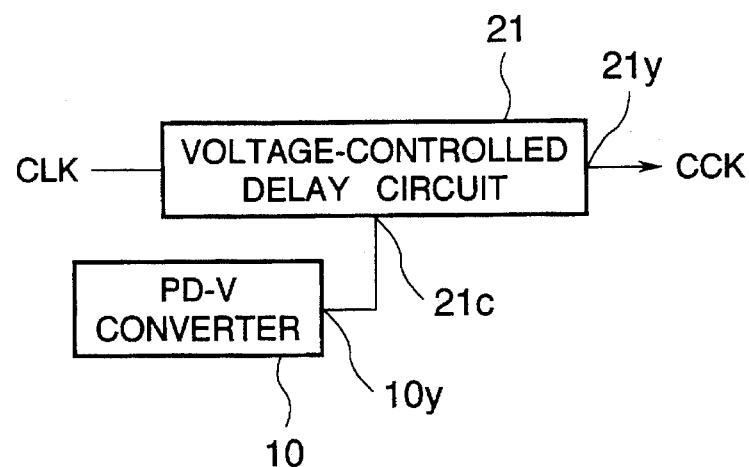
FIG. 12 is a block diagram showing connection of a voltage-controlled delay circuit.

In Embodiments 1 to 4, in place of the voltage-controlled oscillator 20, a voltage-controlled delay circuit 21 may be provided, as illustrated in FIG. 12, with the basic clock CLK being input to an input terminal 21i of the voltage-controlled delay circuit, and the output voltage terminal 10y of the PD-V converter 10 being connected to a control voltage input terminal 21c. The voltage-controlled delay circuit 21 produces a clock which is identical in frequency to the clock input to the input terminal 21i, and whose phase delay relative to the input clock is varied depending on the voltage applied to the control voltage input terminal 21c. In such a case, the output terminal 21y of the voltage-controlled delay circuit 21 may be connected to the input terminal I1 of the clock supply circuit 30 and the input terminal 40i of the dummy clock circuit 40 in Embodiment 1, and to the common clock line CCK in Embodiments 2 to 4. The frequency of the internal clock or the block clock can be kept identical to the frequency of the basic clock. Accordingly, the pull-in time of the PLL can be shortened, and the waiting time after the power on can be shortened. Moreover, restrictions on the circuit parameters in the PD-V converter 10 are alleviated, and the phase difference between the internal clock or the block clock and the basic clock can be further reduced.

In Embodiments 1 to 4, a delay circuit may be inserted on the feedback clock line FCK. When the basic clock CLK is input from outside of the chip, it is input via an input buffer, and this input buffer may cause a phase difference between the clock outside of the chip and the basic clock in the chip. The delay circuit on the feedback clock line FCK compensates for the phase difference.

Figure 13:
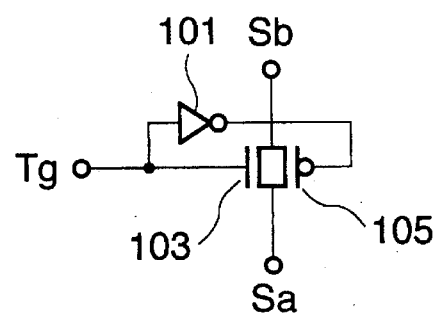
FIG. 13 is a circuit diagram of a switch circuit.

In Embodiments 2 to 4, the first and second switch circuits may be configured of a circuit shown in FIG. 13. The switch circuit of FIG. 13 comprises an NMOS transistor 103 having its drain or source connected to the first terminal Sa, and the source or drain connected to the second terminal Sb, and a PMOS transistor 105 having its source or drain connected to the first terminal Sa and the drain or source connected to the second terminal Sb. The gate of the NMOS transistor 103 is connected to the control terminal Tg, and the gate of the PMOS transistor 105 is connected to the control terminal Tg via an inverter 101. The capacitance of the block clock line of the block selected by this switch circuit, and the capacitance of the feedback clock line FCK or the common output line CMSW are both driven by a single block clock supply circuit, so float the phase difference between the block clock line and the common output line CMSW can be reduced. Accordingly, the block clock with a smaller phase difference can be obtained.

Figure 14:
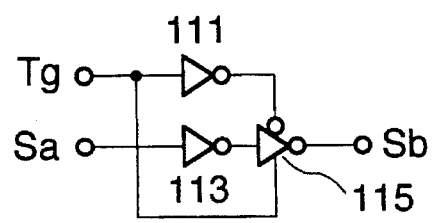
FIG. 14 is a circuit diagram of another switch circuit.

The first and second switch circuits in Embodiments 2 to 4 can be configured as shown in FIG. 14. The switch circuit of FIG. 14 comprises an inverter 111 having its input terminal connected to the control terminal Tg, an inverter 113 having its input terminal connected to the first terminal Sa, and a clocked inverter 115 having its input terminal connected to the output terminal of the inverter 113, and its output terminal connected to the second terminal Sb. The clocked inverter 115 has its first gate terminal connected to the control terminal Tg, and a second gate terminal connected to the output terminal of the inverter 111 to the control terminal TK. With the switch circuit of FIG. 14, the capacitance of the block clock line of the selected block and the capacitance of the feedback clock line FCK or the common output line CMSW are separated by the respective switch circuit. Accordingly, a sharply-varying block clock can be obtained.

The dummy clock circuit 40 of Embodiment 1, 3 or 4 may comprise a gate circuit for halting the generation of the dummy clock when the operation mode control signal MD2 is active. With such an arrangement, the power consumption can be reduced when the operation mode control signal MD2 is active.

The selector 50 in Embodiment 3 or the second switch SWS in Embodiment 4 may be replaced by other switching circuit for connecting the output of the dummy clock circuit to the second input terminal of the PD-V converter 10 when the operation mode control signal is in the stand-by state.

As has been described, according to the invention, supply of the local clock is halted when the clock circuit is in the stand-by state, and yet when the clock circuit is switched between the active state and the stand-by state, the lock-on state of the PLL is maintained. Accordingly, it is possible to obtain a clock circuit with which switching between the stand-by state and the active state can be achieved quickly, and power consumption during the stand-by state can be reduced, and the clock skew can be reduced.

What is claimed is:

1. A clock circuit for supplying an output clock signal to a logic circuit, comprising:

a phase difference-to-voltage converter having a first input terminal for receiving a basic clock signal and a second input terminal for receiving a feedback clock signal, and outputting a voltage signal corresponding to a phase difference between said basic clock signal and said feedback clock signal;

a voltage-controlled phase controller controlled by the voltage signal from said phase difference-to-voltage converter and outputting a first clock signal;

a clock supply circuit connected to receive said first clock signal, and supplying a second chock signal, as said output clock signal, through its output terminal to said logic circuit;

a dummy clock circuit having a dummy capacitance circuit, connected to receive said first clock signal, and outputting a third clock signal through its output terminal; and a selector selectively connecting the output terminal of the clock supply circuit or the output terminal of the dummy clock circuit with the second input terminal of said phase difference-to-voltage converter in accordance with a control signal, to thereby output the second or third clock signal as said feedback clock signal.

2. The clock circuit as set forth in claim 1, wherein said selector has a first input terminal connected to the output terminal of the clock supply circuit, a second input terminal connected to the output terminal of the dummy clock circuit and an output terminal connected the second input terminal of said phase difference-to-voltage converter, and selectively connecting said first or second input terminal with said output terminal In accordance with said control signal.

3. The clock circuit as set forth in claim 1, wherein the capacitance of said dummy capacitance circuit is small compared with the equivalent capacitance of said logic circuit.

4. The clock circuit as set forth in claim 1, further comprising a controller for generating said control signal, said controller comprising:

a delay circuit receiving said basic clock signal and outputting a delayed basic clock signal; and a flip-flop having a clock input terminal receiving said delayed basic clock signal from said delay circuit is connected, and a data input terminal receiving an externally-supplied operation mode control signal.

5. The clock circuit as set forth in claim 1, wherein said voltage-controlled phase controller comprises a voltage-controlled oscillator oscillating at a frequency dependent on said voltage signal from said phase difference-to-voltage converter.

6. The clock circuit as set forth in claim 1, wherein said voltage-controlled phase controller comprises a voltage-controlled delay circuit receiving said basic clock signal, and delaying said basic clock signal by an amount dependent on said voltage signal from said phase difference-to-voltage converter.

7. A clock circuit for supplying block clock signals to logic circuits, comprising:

a phase difference-to-voltage converter having a first input terminal for receiving a basic clock signal and a second input terminal for receiving a feedback clock signal, and outputting a voltage signal corresponding to a phase difference between said basic clock signal and said feedback clock signal;

a voltage-controlled phase controller controlled by the voltage signal from said phase difference-to-voltage converter and outputting a first clock signal;

a decoder responsive to a block address signal and providing block selection signals to respective block selection lines, and making a selected one of the block selection signals active in accordance with the block address signal;

a plurality of block clock supply circuits having respective first input terminals connected to receive said first clock signal, and having respective second input terminals connected to the respective selection lines, each of the block clock supply circuits outputting said block clock signal to the corresponding logic circuit when the corresponding block selection signal is active; and a plurality of switch circuits, each supplying, when the corresponding block selection signal is active, the block clock signal from the corresponding block clock supply circuit to said second input terminal of the phase difference-to-voltage converter.

8. The clock circuit as set forth in claim 7, wherein said plurality of switch circuits have respective control terminals connected to the respective block selection lines, respective first terminals connected to receive the block clock signals from the respective block clock supply circuits, and second terminals commonly connected to a common output line, which in turn is coupled to the second input terminal of the phase difference-to-voltage converter, and each of said switch circuits connecting its first and second terminals together, when the corresponding block selection signal is active.

9. The clock circuit as set forth in claim 8, wherein said common output line is directly connected to the second input terminal of the phase difference-to-voltage converter.

10. The clock circuit as set forth in claim 7, wherein said decoder comprises:

a delay circuit receiving said basic clock and outputting a delayed basic clock;

a plurality of flip-flops having clock input terminals receiving said delayed basic clock from said delay circuit, and data input terminals receiving respective bits of said block address signal.

11. The clock circuit as set forth in claim 7, wherein said voltage-controlled phase controller comprises a voltage-controlled oscillator oscillating at a frequency dependent on said voltage signal from said phase difference-to-voltage converter.

12. The clock circuit as set forth in claim 7, wherein said voltage-controlled phase controller comprises a voltage-controlled delay circuit receiving said basic clock signal, and delaying said basic clock signal by an amount dependent on said voltage signal from said phase difference-to-voltage converter.

13. The clock circuit as set forth in claim 7, further comprising a controller for generating said control signal, said controller comprising:

a delay circuit receiving said basic clock signal and outputting a delayed basic clock signal; and a flip-flop having a clock input terminal receiving said delayed basic clock signal from said delay circuit is connected, and a data input terminal receiving an externally-supplied operation mode control signal.

14. The clock circuit as set forth in claim 7, wherein said decoder is responsive also to said control signal and all the block selection signals being in an inactive state when the control signal is in a first state;

said clock circuit further comprises:
- a dummy clock circuit having a dummy capacitance circuit, connected to receive said first clock signal, and outputting a dummy clock signal through its output terminal; and
- a switching circuit for connecting the output terminal of the dummy clock circuit to said second input terminal of the phase difference-to-voltage converter when said control signal is in said first state.

15. The clock circuit as set forth in claim 14, wherein said switching circuit comprises a selector having a first input terminal connected to the common output line, a second input terminal connected the output terminal of the dummy clock circuit, and an output terminal connected to the second input terminal of the phase difference-to-voltage converter, and connecting the output terminal of the dummy clock circuit with the second input terminal of the phase difference-to-voltage converter when the control signal in said first state, thereby supplying the dummy clock signal to said second output terminal of said phase difference-to-voltage converter as said feedback clock signal; and connecting the common output line with the second input terminal of the phase difference-to-voltage converter responsive to said control signal in a second state, thereby supplying one of the block clock signals to said second input terminal of said phase difference-to-voltage converter as said feedback clock signal.

16. The clock circuit as set forth in claim 14, wherein said switching circuit comprises a second switch circuit having a control terminal receiving said control signal, a first terminal connected to the output terminal of said dummy clock circuit and a second terminal connected to the common output line, and connecting the output terminal of said dummy clock circuit with said common output line when the control signal is in said first state;

whereby one of said block signals and said dummy clock signal is fed from one of said first switch circuits or second switch circuit as said feedback clock signal.

17. The clock circuit as set forth in claim 14, wherein said decoder comprises
- a delay circuit receiving said basic clock, and outputting a delayed basic clock;
- a plurality of flip-flops having clock input terminals receiving said delayed basic clock from said delay circuit, and data input terminals receiving respective bits of said block address signal; and
- a plurality of gate circuits having at least one of input terminals being connected the outputs of the flip-flops, and having input terminals receiving said control signal, and having output terminals connected to the block selection lines.

18. The clock circuit as set forth in claim 14, wherein the capacitance of said dummy capacitance circuit is small compared with the equivalent capacitance of said logic circuits.

\* \* \* \* \*